United States Patent
Tortorelli et al.

(10) Patent No.: US 11,515,358 B2
(45) Date of Patent: Nov. 29, 2022

(54) SEMICONDUCTOR DEVICES INCLUDING A PASSIVE MATERIAL BETWEEN MEMORY CELLS AND CONDUCTIVE ACCESS LINES

(71) Applicant: Micron Technology, Inc., Boise, ID (US)

(72) Inventors: Innocenzo Tortorelli, Milan (IT); Fabio Pellizzer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 186 days.

(21) Appl. No.: 16/863,555

(22) Filed: Apr. 30, 2020

(65) Prior Publication Data

US 2020/0258943 A1    Aug. 13, 2020

Related U.S. Application Data

(63) Continuation of application No. 15/660,491, filed on Jul. 26, 2017, now Pat. No. 10,672,833.

(51) Int. Cl.
*H01L 27/24* (2006.01)
*H01L 45/00* (2006.01)

(52) U.S. Cl.
CPC ...... *H01L 27/2463* (2013.01); *H01L 27/2427* (2013.01); *H01L 45/1246* (2013.01); *H01L 45/1253* (2013.01); *H01L 45/04* (2013.01); *H01L 45/06* (2013.01); *H01L 45/1233* (2013.01); *H01L 45/141* (2013.01); *H01L 45/146* (2013.01)

(58) Field of Classification Search
CPC .................................................. H01L 27/24
See application file for complete search history.

(56) References Cited

U.S. PATENT DOCUMENTS

| | | | |
|---|---|---|---|
| 5,536,947 | A | 7/1996 | Klersy et al. |
| 6,356,477 | B1 | 3/2002 | Tran |
| 7,589,343 | B2 | 9/2009 | Lowrey |
| 8,294,219 | B2 | 10/2012 | Malhotra et al. |
| 8,964,463 | B2 | 2/2015 | Ajika et al. |
| 8,987,702 | B2 | 3/2015 | Mouli |
| 9,018,692 | B2 | 4/2015 | Lung |
| 9,166,158 | B2 | 10/2015 | Lengade et al. |
| 9,318,532 | B2 | 4/2016 | Tanaka et al. |
| 9,362,494 | B2 | 6/2016 | Pellizzer et al. |

(Continued)

FOREIGN PATENT DOCUMENTS

| | | |
|---|---|---|
| CN | 1506972 A | 6/2004 |
| CN | 101939838 A | 3/2013 |

OTHER PUBLICATIONS

Chinese First Office Action for Application No. 201810825243.7, dated Oct. 8, 2021, 19 pages.

(Continued)

*Primary Examiner* — Marvin Payen
(74) *Attorney, Agent, or Firm* — TraskBritt

(57) ABSTRACT

A semiconductor device includes first conductive lines extending in a first direction, second conductive lines extending in a second direction, memory cells disposed between the first conductive lines and the second conductive lines, each memory cell disposed at an intersection of a first conductive line and a second conductive line, and a passive material between the memory cells and at least one of the first conductive lines and the second conductive lines. Related semiconductor devices and electronic devices are disclosed.

12 Claims, 6 Drawing Sheets

(56) References Cited

U.S. PATENT DOCUMENTS

| | | |
|---|---|---|
| 9,577,010 B2 | 2/2017 | Sciarrillo |
| 9,711,717 B2 | 7/2017 | Gotti et al. |
| 9,716,225 B2 | 7/2017 | Chan et al. |
| 9,761,798 B2 | 9/2017 | Kamimuta et al. |
| 9,881,971 B2 | 1/2018 | Lindenberg |
| 10,483,324 B2 | 11/2019 | Hsu |
| 2005/0030787 A1 | 2/2005 | Lowrey et al. |
| 2012/0217461 A1 | 8/2012 | Kobayashi et al. |
| 2013/0048935 A1 | 2/2013 | Gotti et al. |
| 2013/0256624 A1 | 10/2013 | Kau |
| 2014/0361238 A1 | 12/2014 | Joshi et al. |
| 2015/0207066 A1 | 7/2015 | Ohba et al. |
| 2015/0279906 A1 | 10/2015 | Lindenberg |
| 2016/0064666 A1 | 3/2016 | Chan et al. |
| 2016/0163383 A1 | 6/2016 | Tortorelli et al. |
| 2016/0204343 A1 | 7/2016 | Gotti et al. |
| 2016/0293842 A1 | 10/2016 | Tortorelli et al. |
| 2016/0307963 A1 | 10/2016 | Hineman et al. |
| 2016/0351804 A1 | 12/2016 | Campbell |
| 2017/0084345 A1 | 3/2017 | Yang et al. |
| 2017/0117328 A1 | 4/2017 | Terai |
| 2017/0250339 A1 | 8/2017 | Sim et al. |
| 2017/0271592 A1 | 9/2017 | Lee et al. |
| 2017/0288138 A1 | 10/2017 | Lee et al. |
| 2017/0294483 A1 | 10/2017 | Terai et al. |
| 2018/0114900 A1 | 4/2018 | Kamata |
| 2018/0175109 A1 | 6/2018 | Choi et al. |
| 2019/0259813 A1 | 8/2019 | Takuya |
| 2019/0348603 A1 | 11/2019 | Chan et al. |

OTHER PUBLICATIONS

Lee et al., Effect of Ge2Sb2Te5 Thermal Barrier on Reset Operations in Filament—Type Resistive Memory, IEEE Electron Device Letters, vol. 32, No. 11, Nov. 2011, pp. 1573-1575.

Son et al., Excellent Selector Characteristics of Nanoscale VO2 for High-Density Bipolar ReRAM Applications, IEEE Electron Device Letters, vol. 32, No. 11, Nov. 2011, pp. 1579-1591.

SEMICONDUCTOR DEVICES INCLUDING A PASSIVE MATERIAL BETWEEN MEMORY CELLS AND CONDUCTIVE ACCESS LINES

CROSS-REFERENCE TO RELATED APPLICATION

This application is a continuation of U.S. patent application Ser. No. 15/660,491, filed Jul. 26, 2017, now U.S. Pat. No. 10,672,833, issued Jun. 2, 2020, entitled "SEMICONDUCTOR DEVICES INCLUDING A PASSIVE MATERIAL BETWEEN MEMORY CELLS AND CONDUCTIVE ACCESS LINES, AND RELATED ELECTRONIC DEVICES," the disclosure of which is hereby incorporated herein in its entirety by this reference.

TECHNICAL FIELD

Embodiments disclosed herein relate to semiconductor devices including one or more passive materials between conductive access lines and memory cells associated with the semiconductor devices. More particularly, embodiments of the disclosure relate to semiconductor devices including an array of memory cells and at least one passive material disposed between the memory cells and at least one conductive line in electrical communication with the memory cells, and to related electronic systems including such semiconductor devices.

BACKGROUND

A semiconductor device including an array of memory cells may include memory cells located at an intersection between conductive access lines, such as between a conductive word line and a conductive bit line. For example, three-dimensional (3D) cross-point memory devices may include a plurality of memory cells arranged in an array and including a plurality of rows of access lines and a plurality of columns of access lines that may be arranged in a pattern of rows and columns. During operation of the semiconductor device, data may be written to and read from the memory cells. A particular memory cell may be accessed through the conductive access lines in direct electrical communication with that particular memory cell.

As the demand for higher-density memory cell arrays increases, the size of individual cells in a memory array may shrink, the memory array may include more memory cells, or both. As the number of memory cells in the array increases, the number of memory cells in electrical communication with each access line (e.g., with each conductive word line and each conductive bit line) increases. However, as the number of memory cells in electrical communication with the access lines increases, the capacitance of the access lines used to access a particular memory cell is increased.

When an access line is charged during programming (e.g., during a write operation) and/or a read operation, an electric charge may accumulate on the access line. The electric charge may be proportional to the number of memory cells along the entire access line. After the memory cell is selected, the semiconductor device may exhibit a so-called "snapback" effect, in which a voltage across the selected memory cell is rapidly reduced. The snapback effect may be accompanied by a discharge current flowing through the accessed memory cell. However, if the discharge current is too high, the memory cell may be damaged and the performance of the semiconductor device may be negatively impacted. By way of nonlimiting example, too high a discharge current through the memory cell may disturb a programmed state of the selected memory cell for a read operation, may change a threshold voltage during cycling of the memory cells associated with the semiconductor device, and may cause a threshold voltage of different memory cells in the array to be different.

DETAILED DESCRIPTION

Figure 1:
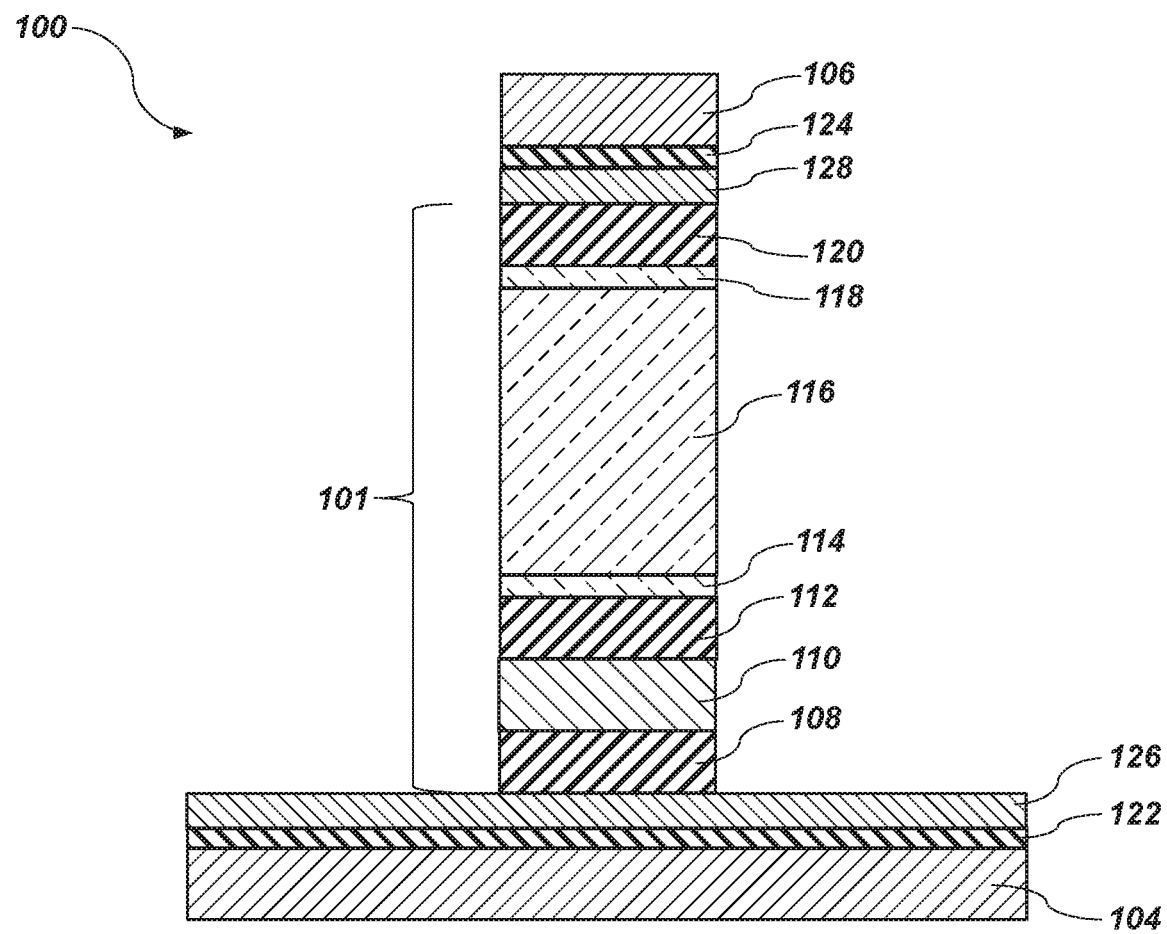
FIG. 1 is a simplified cross-sectional view of a semiconductor device comprising a memory cell disposed between a first conductive line and a second conductive line, according to embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device, a memory cell, or an array of memory cells or a complete description of a process flow for manufacturing a semiconductor device, a memory cell, or an array of memory cells. The structures described below do not form complete semiconductor devices, memory cells, or arrays of memory cells. Only those process acts and structures necessary to understand the embodiments described herein are described in detail below. Additional acts to form a complete semiconductor device, memory cell, or array of memory cells may be performed by conventional techniques.

As used herein, the term "passive" material means and includes a material exhibiting electrically conductive properties when exposed to a voltage greater than a threshold voltage and exhibiting electrically insulative properties when exposed to a voltage less than the threshold voltage. Passive materials may transmit a leakage current or exhibit tunneling properties when exposed to a voltage greater than a threshold voltage. In some embodiments, passive materials may exhibit a non-linear resistance responsive to exposure to changes in an electric field to which the passive materials are exposed. Stated another way, the passive materials may exhibit a non-linear change in resistance responsive to a linear change in an electric field to which the passive materials are exposed.

According to embodiments disclosed herein, a semiconductor device includes one or more memory cells located at intersections between conductive lines, such as between a conductive access line (e.g., a word line) and a conductive data line (e.g., a bit line, a digit line, etc.), which may generally be referred to herein as "conductive access lines" or "conductive lines." By way of nonlimiting example, 3D cross-point memory semiconductor devices may include a plurality of memory cells, each memory cell located at an intersection between conductive lines. Each memory cell may include a memory material (e.g., a phase change material, a resistive material, a ferroelectric material, a charge storage material, etc.) and may further include a switch (e.g., a diode, an ovonic threshold switch, a threshold switching material, a bipolar junction transistor, etc.). The semiconductor device may include at least one passive material between one or more of the conductive lines and one or more memory cells associated with the conductive lines. In some embodiments, the passive material may be formulated and configured to protect the memory cells from exposure to a large discharge current during use and operation of the semiconductor device while allowing sufficient electrical conductivity for operation of the memory cells. In some embodiments, the passive material may include a material that exhibits tunneling characteristics responsive to exposure to a predetermined voltage. In some embodiments, the passive material may comprise aluminum oxide ($Al_2O_3$), which may also be referred to as "alumina." The passive material may substantially reduce a so-called "snapback" effect caused by a large spike in discharge current during cell selection. Semiconductor devices including the passive material may exhibit improved device performance including a reduced read disturb, an increase in an operating voltage of the memory cells of the semiconductor device, a reduced degree of variation in threshold voltage ($V_{th}$) of the memory cells, and a reduced shift in threshold voltage of a particular memory cell over the operating lifetime of the semiconductor device.

FIG. 1 is a simplified cross-sectional view of a semiconductor device 100 comprising a memory cell 101 disposed between a first conductive line 104 and a second conductive line 106 of the semiconductor device 100, according to embodiments of the disclosure. While only one memory cell 101 is illustrated, the semiconductor device 100 may include an array of memory cells 101, each memory cell 101 disposed at an intersection between a first conductive line 104 and a second conductive line 106. The first conductive lines 104 may extend in a first direction that is substantially perpendicular to a direction in which the second conductive lines 106 extend. The first conductive line 104 and the second conductive line 106 may be configured to carry electrical signals such as, for example, a voltage or a current pulse between memory cells 101 and driver circuitry associated with the semiconductor device 100.

The first conductive line 104 and the second conductive line 106 may include an electrically conductive material. By way of nonlimiting example, each of the first conductive line 104 and the second conductive line 106 may independently include aluminum, copper, nickel, chromium, cobalt, ruthenium, rhodium, palladium, silver, platinum, gold, iridium, tantalum, tungsten, conductive metal nitrides (e.g., TiN, TaN, WN, etc.), conductive metal silicides (e.g., tantalum silicides, tungsten silicides, nickel silicides, titanium silicides, etc.), and combinations thereof. In some embodiments, the first conductive line 104 and the second conductive line 106 comprise tungsten.

The memory cell 101 may be disposed between the first conductive line 104 and the second conductive line 106 and may be in electrical communication with each of the first conductive line 104 and the second conductive line 106. The memory cell 101 may include a first electrode 108 (e.g., a bottom electrode) disposed over the first conductive line 104. The first electrode 108 may include tungsten, titanium, platinum, ruthenium, ruthenium oxide ($RuO_x$), metal nitrides (such as tungsten nitride ($WN_x$), titanium nitride ($TiN_x$), tantalum nitride ($TaN_x$), titanium aluminum nitride ($TiAl_xN_y$)), carbon, a carbon-containing compound (such as a carbon nitride, titanium carbon nitride ($TiC_xN_y$), tantalum carbon nitride ($TaC_xN_y$), titanium silicon carbon nitride ($TiAlC_xN_y$), titanium aluminum carbon nitride ($TiAlC_xN_y$), titanium silicon aluminum carbon nitride ($TiSiAlC_xN_y$), tungsten carbon nitride ($WC_xN_y$), tantalum carbon oxynitride ($TaCO_xN_y$), and tungsten silicon carbon nitride ($WSiC_xN_y$)), a carbon containing metal silicide, polysilicon, another conductive material, and combinations thereof, wherein x is between about 0 and about 6.0 and y is between about 0 and about 6.0.

A selector material 110 may directly overlie and contact the first electrode 108. The selector material 110 may be formulated and configured to controllably allow a voltage to be applied to different elements of the memory cell 101 responsive to application of a voltage or another property thereto. By way of nonlimiting example, the selector material 110 may include a two terminal device (e.g., a switch), such as a diode, an ovonic threshold switch (OTS), a tunnel junction, a mixed ionic electronic conduction switch (MIEC), or another two terminal device. In other embodiments, the selector material 110 may include a three terminal device (e.g., a switch), such as a field effect transistor (FET), a bipolar junction transistor (BJT), or another three terminal device. The selector material 110 may also be referred to herein as a "select device."

In some embodiments, the selector material 110 includes a chalcogenide compound. As used herein, a "chalcogenide compound" refers to a binary or multinary compound that includes at least one chalcogen atom and at least one more electropositive element or radical. As used herein, the term "chalcogen" refers to an element of Group VI of the Periodic Table, such as oxygen (O), sulfur (S), selenium (Se), tellurium (Te), or polonium (Po). The electropositive element may include, but is not limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. The chalcogenide compound may be a binary, ternary, quaternary, quinary, senary, or a septenary alloy.

By way of nonlimiting example, the selector material 110 may be a chalcogenide compound including the chalcogen element and the electropositive element. The chalcogen element may be at least one of O, S, Se, Te, or Po. The electropositive element may include, but is not limited to, N, Si, Ni, Ga, Ge, As, Ag, In, Cd, Zn, Sn, Sb, Au, Pb, Bi, Cr, Nb, Pd, Pt, or combinations thereof. Nonlimiting examples of chalcogenide compounds suitable for use as the selector material 110 include Si, As, Se compounds; As and Te compounds, such as $As_2Te_3$; As and Se compounds, such as $As_2Se_3$; As, Te, and Ge compounds, such as $As_{30}Te_{45}Ge_{25}$; As, Se, and Ge compounds, such as $As_{28}Se_{42}Ge_{30}$; As, S, Se, and Ge compounds, such as $As_{30}S_{12}Se_{33}Ge_{25}$; and As, Te, Ge, Si, and In compounds, such as $As_{37}Te_{39}Ge_9Si_{14}In$. In at least some embodiments, the selector material 110 is $As_{37}Te_{39}Ge_9Si_{14}In$. In other embodiments, the selector material 110 includes arsenic, selenium, silicon, and germanium.

A second electrode 112 may directly overlie and contact the selector material 110. The second electrode 112 may include conductive materials substantially similar to the conductive materials described above with reference to the first electrode 108. In some embodiments, the second electrode 112 includes the same material as the first electrode 108. In other embodiments, the second electrode 112 includes a material that is different from a material of the first electrode 108.

An interfacial material 114 may directly overlie and contact the second electrode 112 and may be disposed between the second electrode 112 and a memory material 116. In some embodiments, the interfacial material 114 includes tungsten or a tungsten-containing material.

The memory material 116 may directly overlie and contact the interfacial material 114. The memory material 116 may include any material (e.g., a programmable material) configured to be electrically switched or changed (i.e., configured to reversibly electrically switch or change) between a first phase and a second phase different in at least one detectable (e.g., measureable) property (e.g., electrical resistivity, electrical conductivity, optical transmissivity, optical absorption, optical refraction, optical reflectivity, morphology, surface topography, relative degree of order, relative degree of disorder, or combinations thereof). By way of nonlimiting example, each physical state of the memory material 116 may exhibit a particular electrical resistance that may be used to distinguish between logic values of the associated memory cell 101.

The memory material 116 may include a storage material suitable for a resistive-type memory cell (RRAM) (e.g., a dielectric-based resistive random access memory storage element), a dynamic random-access memory (DRAM) cell, a phase-change RAM (PCRAM) cell, a conductive-bridge RAM cell, a ferroelectric RAM (FeRAM) cell, a spin-transfer torque RAM (STTRAM) cell. The memory material 116 may include a transition metal oxide (e.g., NiO, $HfO_2$, $ZrO_2$, $Cu_2O$, $TaO_2$, $Ta_2O_5$, $TiO_2$, $SiO_2$, $Al_2O_3$, and combinations thereof), transition metals, alkaline earth metals, rare earth metals, a chalcogenide material, binary metal oxides, colossal magnetoresistive materials, polymer-based resistive materials, and combinations thereof. In some embodiments, the memory material 116 may include a compound including a chalcogenide and the selector material 110 may include a different compound including the same or different chalcogenides than the memory material 116.

Another interfacial material 118 may directly overlie and contact the memory material 116. The another interfacial material 118 may include the same material as the interfacial material 114. In other embodiments, the another interfacial material 118 may include a material different from the interfacial material 114.

A third electrode (e.g., a top electrode) 120 may directly overlie and contact the another interfacial material 118. The third electrode 120 may include conductive materials substantially similar to the conductive materials described above with reference to the first electrode 108 and the second electrode 112. In some embodiments, the third electrode 120 includes the same material as at least one of the first electrode 108 and the second electrode 112. In other embodiments, the third electrode 120 includes a material that is different from a material of the first electrode 108 or the second electrode 112.

The semiconductor device 100 may include a passive material 122 disposed between the first conductive line 104 and the memory cell 101. The passive material 122 may exhibit an electrical conductivity less than an electrical conductivity of the first conductive line 104 and the second conductive line 106. In some embodiments, the passive material 122 may include a dielectric material.

In some embodiments, the passive material 122 may directly contact and overlie the first conductive line 104. The passive material 122 may include a material formulated and configured to exhibit an electrical conductivity sufficient to provide a current and voltage to the memory cell 101 during operation of the semiconductor device 100, while also exhibiting a desired electrical resistance to reduce a magnitude of a current discharge through the memory cell 101 during accessing of the memory cell 101, such as during programming and sensing (e.g., during writing and reading operations). In some embodiments, the passive material 122 may be formulated and configured to exhibit tunneling properties, current leakage properties, or both.

The passive material 122 may have a thickness such that the passive material 122 exhibits current leakage and tunneling properties responsive to exposure to a voltage (e.g., a threshold voltage). In some embodiments, the thickness of the passive material 122 may be between about 0.5 nm and about 10 nm, such as between about 0.5 nm and about 1.0 nm, between about 1 nm and about 3 nm, between about 3 nm and about 5 nm, between about 5 nm and about 7 nm, or between about 7 nm and about 10 nm. In some embodiments, the thickness of the passive material 122 is less than about 10 nm. In some embodiments, the thickness of the passive material 122 is between about 1 nm and about 10 nm. In other embodiments, the thickness of the passive material 122 may be greater than about 10 nm, such as between about 10 nm and about 20 nm.

The passive material 122 may include aluminum oxide ($Al_2O_3$) (also referred to as alumina), tungsten silicon nitride (WSiN), titanium silicon nitride (TiSiN), a metal nitride (e.g., titanium nitride (TiN), tungsten nitride (WN), tantalum nitride (TaN), other metal nitrides, or combinations thereof), silicon nitride ($Si_3N_4$), a metal silicide (e.g., tungsten silicide, titanium silicide, tantalum silicide, etc.), and combinations thereof. In some embodiments, the passive material 122 comprises aluminum oxide. In other embodiments, the passive material 122 includes tungsten silicon nitride.

The semiconductor device 100 may further include another passive material 124 between the memory cell 101 and the second conductive line 106. In some embodiments, the another passive material 124 may underlie and directly contact the second conductive line 106. The another passive material 124 may be formulated and configured to exhibit an electrical resistance and may be formulated and configured to exhibit tunneling properties or current leakage properties, similar to the passive material 122.

The another passive material 124 may have a thickness such that the another passive material 124 exhibits an electrical resistance while also exhibiting current leakage and tunneling properties responsive to exposure to a voltage (e.g., a threshold voltage). In some embodiments, the thickness of the another passive material 124 may be between about 0.5 nm and about 10 nm, such as between about 0.5 nm and about 1 nm, between about 1 nm and about 3 nm, between about 3 nm and about 5 nm, between about 5 nm and about 7 nm, or between about 7 nm and about 10 nm. In some embodiments, the thickness of the another passive material 124 is less than about 10 nm. In other embodiments, the thickness of the another passive material 124 may be greater than about 10 nm, such as between about 10 nm and about 20 nm. In some embodiments, the thickness of the another passive material 124 may be the same as the thickness of the passive material 122.

The another passive material 124 may include any of the materials described above with reference to the passive material 122. By way of nonlimiting example, the another passive material 124 may include aluminum oxide, tungsten silicon nitride (WSiN), titanium silicon nitride (TiSiN), a metal nitride (e.g., titanium nitride (TiN), tungsten nitride (WN), tantalum nitride (TaN), other metal nitrides, or combinations thereof), silicon nitride ($Si_3N_4$), a metal silicide (e.g., tungsten silicide, titanium silicide, tantalum silicide, etc.), and combinations thereof. In some embodiments, the another passive material 124 comprises aluminum oxide. In some embodiments, the another passive material 124 includes tungsten silicon nitride. The another passive material 124 may include the same material as the passive material 122. In other embodiments, the another passive material 124 may include a material different from a material of the passive material 122.

With continued reference to FIG. 1, the semiconductor device 100 may include a semimetal material 126 (e.g., a metal exhibiting a relatively high electrical resistance) directly contacting and overlying the passive material 122 and disposed directly between the passive material 122 and the first electrode 108. The semimetal material 126 may be formulated and configured to exhibit an electrical conductivity that is greater than an electrical conductivity of the passive material 122 and less than an electrical conductivity of the first conductive line 104. In some embodiments, the semimetal material 126 may exhibit semiconductive properties.

The semimetal material 126 may include a metal silicide (e.g., tungsten silicide, titanium silicide, tantalum silicide, another metal silicide), a metal silicon nitride (e.g., tungsten silicon nitride (WSiN), titanium silicon nitride (TiSiN)), a metal nitride, and combinations thereof. In some embodiments, the semimetal material 126 includes the same metal as the first conductive line 104. In some embodiments, the semimetal material 126 includes tungsten silicon nitride.

The semimetal material 126 may have a thickness between about 1 nm and about 20 nm, such as between about 1 nm and about 5 nm, between about 5 nm and about 10 nm, or between about 10 nm and about 20 nm. In some embodiments, the thickness of the semimetal material 126 may be greater than the thickness of the passive material 122 and the another passive material 124.

Another semimetal material 128 may directly overlie and contact the third electrode 120. The another semimetal material 128 may be disposed directly between the third electrode 120 and the another passive material 124. The another semimetal material 128 may comprise one or more of the materials described above with reference to the semimetal material 126. In some embodiments, the another semimetal material 128 includes the same material as the semimetal material 126. In other embodiments, the another semimetal material 128 includes a material different from a material of the semimetal material 126. In some embodiments, the another semimetal material 128 may include tungsten silicon nitride.

The thickness of the another semimetal material 128 may be between about 1 nm and about 20 nm, such as between about 1 nm and about 5 nm, between about 5 nm and about 10 nm, or between about 10 nm and about 20 nm. In some embodiments, the thickness of the another semimetal material 128 may be greater than the thickness of the passive material 122 and the another passive material 124.

Without wishing to be bound by any particular theory, it is believed that one or both of the passive materials 122, 124 between the memory cell 101 and each of the first conductive line 104 and the second conductive line 106, respectively, reduces the current discharge through the memory cell 101 during selection of the memory cell 101. When the memory cell 101 is accessed, a charge may accumulate along one of the first conductive line 104 and the second conductive line 106 through which the memory cell 101 is accessed (e.g., a bit line). The accumulated charge may be proportional to a resistance of the conductive line and a number of memory cells operably coupled to the conductive line. After the memory cell 101 is selected, the accumulated charge may discharge through the selected cell. A voltage across the memory cell 101 may be reduced (e.g., snapback) while the current through the memory cell 101 is increased. It is believed that the passive materials 122, 124 reduce the magnitude of the discharge current through the memory cell 101 by increasing a resistance between the first conductive line 104 and the second conductive line 106 through the memory cell 101. Accordingly, the selector material 110 and the memory material 116 may be exposed to a discharge current and voltage having a lower magnitude than if the passive materials 122, 124 were not present. It is believed that, in some embodiments, including the semimetal materials 126, 128 in the semiconductor device 100 may further reduce a magnitude of the discharge current and voltage to which the selector material 110 and the memory material 116 may be exposed.

Since the passive materials 122, 124 and the semimetal materials 126, 128 are not disposed directly in the memory cell 101 stack, the performance of the memory cell 101 may not be substantially affected by the presence of the passive materials 122, 124 and the semimetal materials 126, 128.

Figure 2:
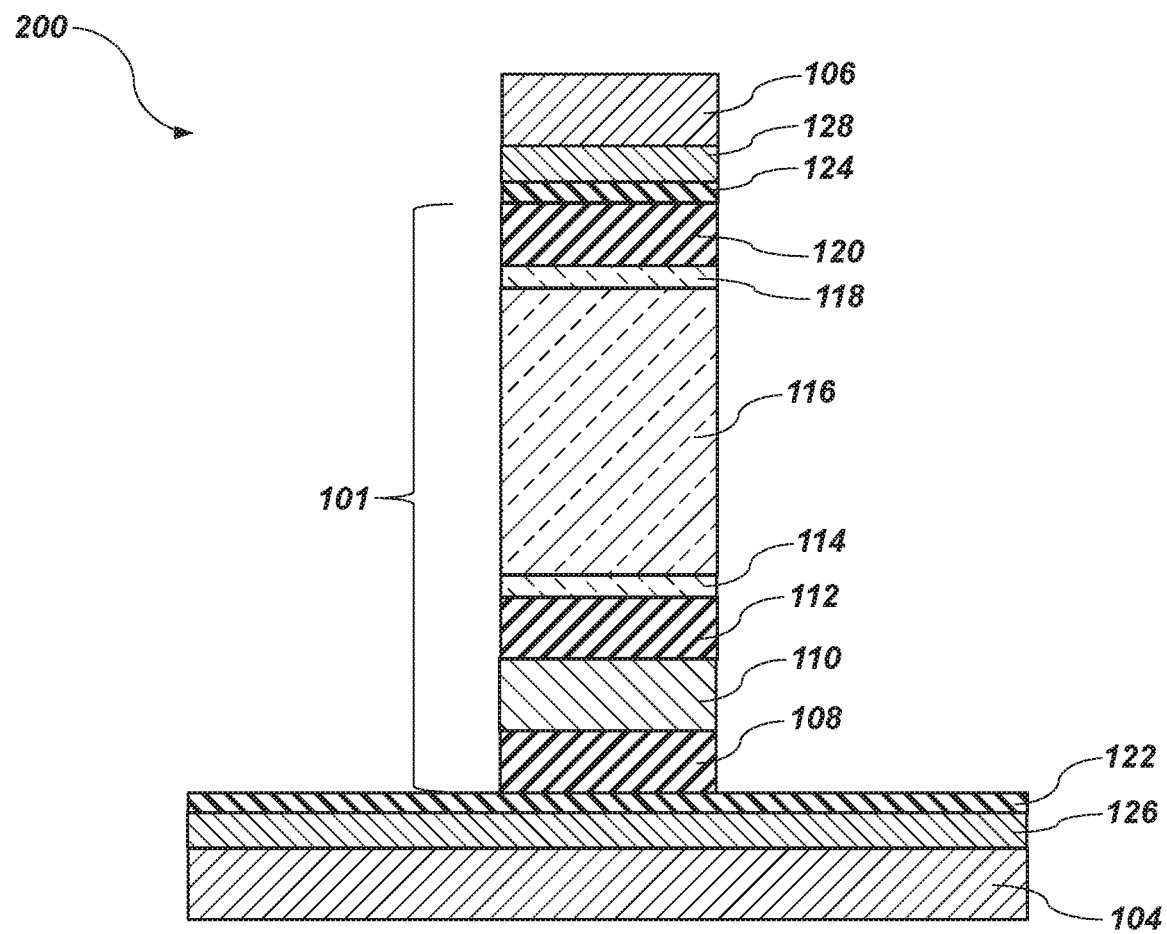
FIG. 2 is a simplified cross-sectional view of a semiconductor device comprising a memory cell disposed between a first conductive line and a second conductive line, according to other embodiments of the disclosure.

FIG. 2 is a simplified cross-sectional view of a semiconductor device 200 comprising a memory cell 101 disposed between a first conductive line 104 and a second conductive line 106 of the semiconductor device 200, according to other embodiments of the disclosure. The semiconductor device 200 may be substantially similar to the semiconductor device 100 described with reference to FIG. 1, except that a relative position of the passive materials 122, 124 and the semimetal materials 126, 128 may be changed.

The semiconductor device 200 may include the semimetal material 126 overlying and in direct contact with the first conductive line 104. The passive material 122 may overlie and directly contact the semimetal material 126. The passive material 122 may be in direct contact with the memory cell 101, such as with the first electrode 108.

The another passive material 124 may overlie and directly contact the third electrode 120. The second semimetal material 128 may overlie and directly contact the another passive material 124. The second conductive line 106 may overlie and directly contact the another semimetal material 128.

In some embodiments, one or both of the semimetal material 126 and the second semimetal material 128 may include a same metal as a metal of the first conductive line 104 and the second conductive line 106, respectively. By way of nonlimiting example, where the first conductive line 104 and the second conductive line 106 comprise tungsten, the semimetal material 126 and the second semimetal material 128 may include tungsten silicon nitride.

Including the semimetal material 126 between the first conductive line 104 and the passive material 122 may increase a resistance between the first conductive line 104 and the second conductive line 106 relative to the semiconductor device 100 described with reference to FIG. 1, which may further reduce a discharge current and snapback effect through the memory cell 101.

Figure 3:
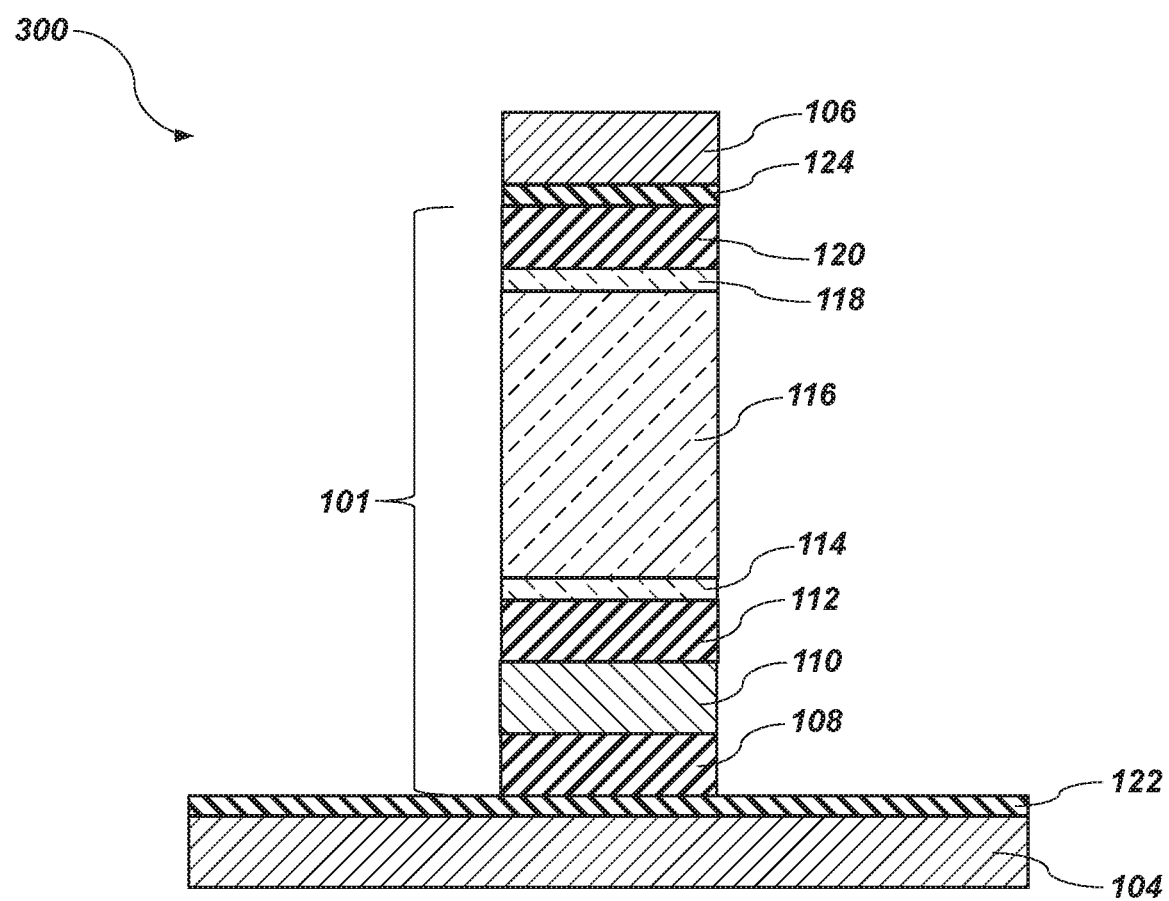
FIG. 3 is a simplified cross-sectional view of a semiconductor device comprising a memory cell disposed between a first conductive line and a second conductive line, according to yet other embodiments of the disclosure.

FIG. 3 is a simplified cross-sectional view of a semiconductor device 300 comprising a memory cell 101 disposed between a first conductive line 104 and a second conductive line 106 of the semiconductor device 300, according to embodiments of the disclosure. The semiconductor device 300 may be substantially the same as the semiconductor devices 100, 200 described above with reference to FIG. 1 and FIG. 2, respectively, except that the semiconductor device 300 may not include the semimetal material 126 and the second semimetal material 128.

The semiconductor device 300 may include the passive material 122 and the another passive material 124. The passive material 122 may overlie and directly contact the first conductive line 104. In some embodiments, the passive material 122 may also directly contact the memory cell 101, such as at the first electrode 108.

The another passive material 124 may overlie and directly contact the memory cell 101, such as at the third electrode 120. The another passive material 124 may also directly contact the memory cell 101, such as at the third electrode 120.

Although FIG. 1 through FIG. 3 have been described and illustrated as including the passive materials 122, 124 on each side of the memory cells 101, the disclosure is not so limited. In some embodiments, the semiconductor devices 100, 200, 300 may not include one of the passive material 122 and the another passive material 124 and may include only the other of the passive material 122 and the another passive material 124. Thus, the semiconductor devices 100, 200, 300 may include at least one of the passive material 122 and the another passive material 124. In some embodiments, the semiconductor device 100, 200, 300 may include the passive material 122 only on a side of the memory cell 101 proximate the memory material 116. In other embodiments, the semiconductor device 100, 200, 300 may include the passive material 124 only on a side of the semiconductor device proximate the selector material 110. Similarly, although FIG. 2 and FIG. 3 have been described as including the semimetal material 126 and the another semimetal material 128, the disclosure is not so limited. In some embodiments, the semiconductor device 100, 200 may not include one of the semimetal material 126 and the another semimetal material 128 and may include only the other of the semimetal material 126 and the another semimetal material 128.

Although FIG. 1 through FIG. 3 have been described and illustrated as including the selector material 110 proximate the first electrode 108 and the memory material 116 above the selector material 110 and proximate the third electrode 120, the disclosure is not so limited. In other embodiments, a relative position of the selector material 110 and the memory material 116 may be reversed and the memory material 116 may be located closer to the first electrode 108 than the selector material 110.

Although the memory cell 101 in FIG. 1 through FIG. 3 has been described as only including the first electrode 108, the selector material 110, the second electrode 112, the interfacial material 114, the memory material 116, the another interfacial material 118, and the third electrode 120, the disclosure is not so limited. In some embodiments, the memory cell 101 may include a passive material. By way of nonlimiting example, in some embodiments, the memory cell 101 may include one or more passive materials proximate (e.g., in contact with) the selector material 110, the memory material 116, or both. By way of nonlimiting example, the one or more passive materials of the memory cell 101 may be disposed between the selector material 110 and the first electrode 108, between the selector material 110 and the second electrode 112, between the second electrode 112 and one of the interfacial material 114 and the memory material 116, between the third electrode 120 and one of the memory material 116 and the another interfacial material 118, and combinations thereof. In some embodiments, the one or more passive materials of the memory cell 101 may include the same material as the passive materials 122, 124. By way of nonlimiting example, the one or more passive materials of the memory cell 101 may include aluminum oxide. In other embodiments, the passive material of the memory cell 101 may include tungsten silicon nitride.

The semiconductor devices 100, 200, 300 including the passive materials 122, 124 may exhibit an improved performance compared to conventional semiconductor devices. For example, the passive materials 122, 124 may reduce an amount of read disturb (e.g., an amount that a programmed cell may be disturbed responsive to exposure to a spike discharge current during a read operation), may reduce a variation in threshold voltage between different memory cells in the array, may reduce a shift in threshold voltage of a particular memory cell over the lifetime of the semiconductor device, and may increase an on voltage of the memory cells. Without wishing to be bound by any particular theory, it is believed that including the passive materials between the memory cells and the first conductive lines and the second conductive lines decreases a voltage and a current to which unselected memory cells in the array are exposed. Since the unselected memory cells are exposed to a reduced voltage and current, they may be less likely to be undesirably selected or programmed during use and operation of the associated memory device.

In addition, since a spike discharge current to which the memory cells are exposed during cell selection is reduced, the memory materials may not be damaged and the memory cells may retain their electrical characteristics over time. The reduction of the spike discharge current and the associated snapback effect may reduce a threshold voltage variation between memory cells in the array and a threshold voltage shift during cycling of the memory cells over the lifetime of the semiconductor device. Accordingly, the semiconductor device may exhibit an improved performance and greater reliability compared to semiconductor devices including memory cells that do not include the passive materials.

Accordingly, in some embodiments, a semiconductor device comprises first conductive lines extending in a first direction, second conductive lines extending in a second, different direction, memory cells disposed between the first conductive lines and the second conductive lines, each memory cell disposed at an intersection of a first conductive line and a second conductive line, and a passive material between each of the memory cells and at least one of the first conductive lines and the second conductive lines.

Accordingly, in at least some embodiments, a semiconductor device comprises at least one memory cell comprising a memory material, a selector material, and an electrode between the memory material and the selector material. The semiconductor device further comprises a conductive access line on a first side of the at least one memory cell, another conductive access line on a second, opposite side of the at least one memory cell, and at least one passive material between the at least one memory cell and at least one of the conductive access line and the another conductive access line.

Figure 4:
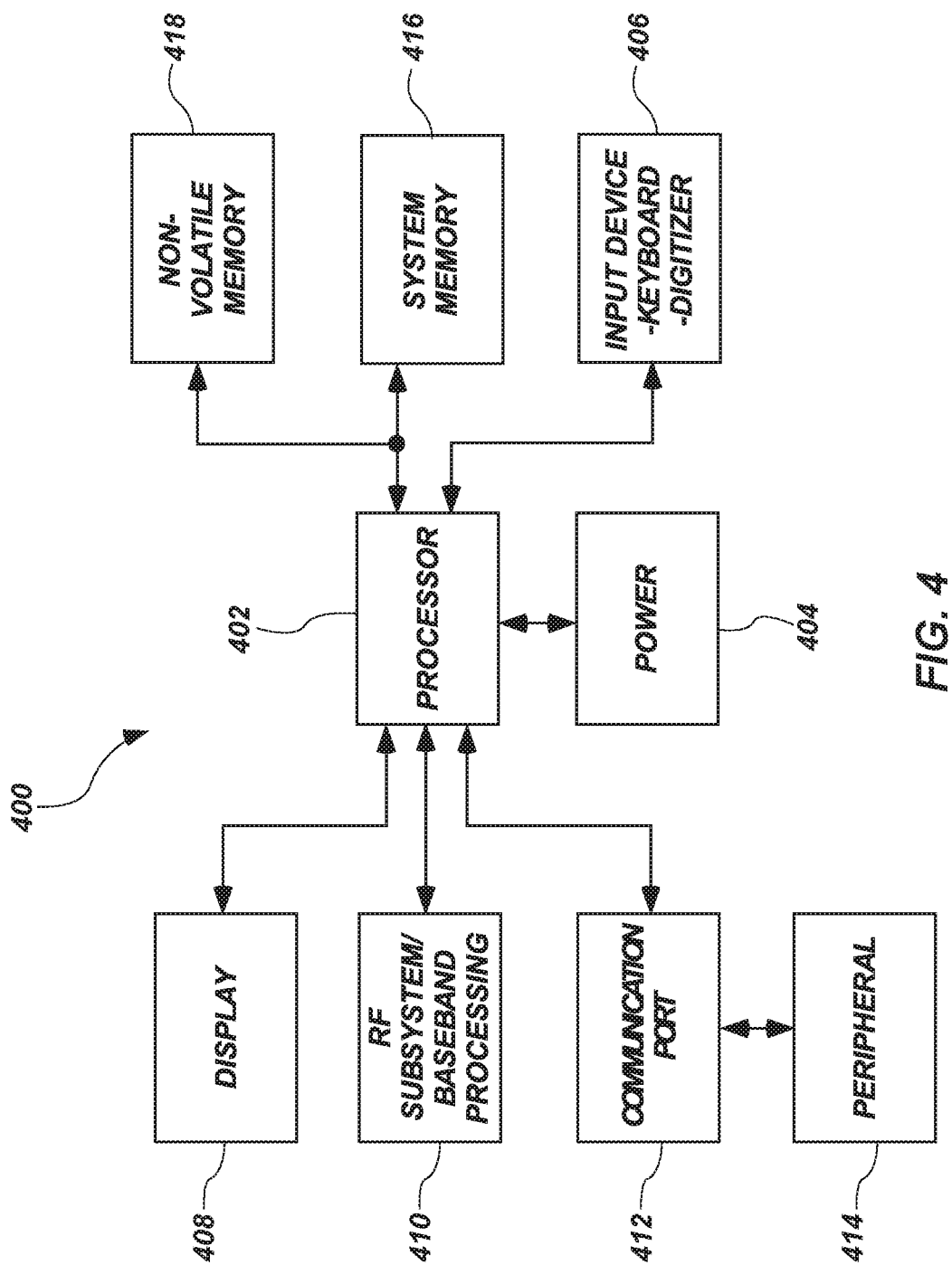
FIG. 4 is a simplified block diagram of a system implemented according to one or more embodiments of the disclosure.

With reference to FIG. 4, depicted is a processor-based system 400. The processor-based system 400 may include various electronic devices manufactured in accordance with embodiments of the present disclosure. The processor-based system 400 may be any of a variety of types such as a computer, camera, pager, cellular phone, wireless device, display, chip set, set-top box, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include or be coupled to memory cells, memory arrays, and semiconductor devices including the passive materials between conductive access lines and memory cells in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter receptacle or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include a liquid crystal display (LCD), a surface-conduction electron-emitter display (SED), a cathode ray tube (CRT) display, a digital light processing (DLP) display, a plasma display, an organic light-emitting diode (OLED) display, a light-emitting diode (LED) display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory may be operably coupled to the processor 402 to store and facilitate execution of various programs. For example, the processor 402 may be coupled to system memory 416, which may include one or more types of volatile memory, such as dynamic random access memory (DRAM). The system memory 416 may further include other types of volatile memory, non-volatile memory, or a combination thereof. In some embodiments, the system memory 416 may include semiconductor devices, such as the semiconductor devices including passive materials between conductive access lines and memory cells, as described above.

The processor 402 may also be coupled to non-volatile memory 418. The non-volatile memory 418 may include one or more of STT-MRAM, MRAM, read-only memory (ROM) such as an EPROM, resistive read-only memory (RROM), and Flash memory to be used in conjunction with the system memory 416. The size of the non-volatile memory 418 is typically selected to be just large enough to store any necessary operating system, application programs, and fixed data. Additionally, the non-volatile memory 418 may include a high capacity memory such as disk drive memory, such as a hybrid-drive including resistive memory or other types of non-volatile solid-state memory, for example.

Figure 5:
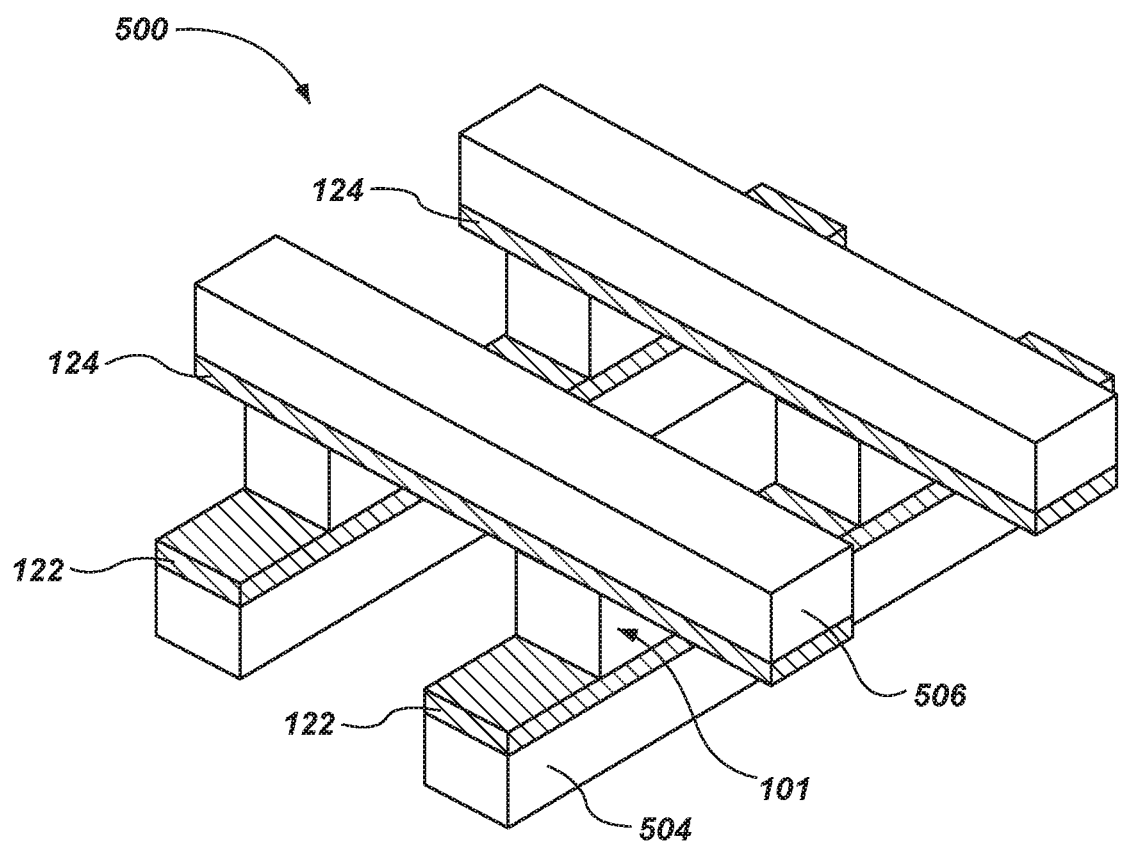
FIG. 5 is a perspective view of a memory cell array including a plurality of memory cells and the passive material between the memory cells and conductive access lines, according to embodiments of the disclosure.

FIG. 5 is a memory array 500 including a plurality of memory cells 101. The memory cells 101 may be the same as the memory cells 101 described above with reference to FIG. 1 through FIG. 3. The memory cells 101 may be positioned between a plurality of word lines 504 and a plurality of digit lines 506, which may correspond to the first conductive lines 104 and the second conductive lines 106 described with reference to FIG. 1 through FIG. 3. The memory array 500 may include the passive material 122 between memory cells 101 and the digit lines 506 and the another passive material 124 between the memory cells 101 and the word lines 504. In some embodiments, the memory array 500 may further include the semimetal material 126 and the another semimetal material 128 between the memory cells 101 and the digit lines 506 and word lines 504.

Each of the word lines 504 may extend in a first direction and may connect to a row of memory cells 101. Each of the digit lines 506 may extend in a second direction (which, in some embodiments, may be at least substantially perpendicular) to the first direction and may connect to a column of the memory cells 101. A voltage applied to the word lines 504 and the digit lines 506 may be controlled such that an electric field may be selectively applied to at least one word line 504 and at least one digit line 506, enabling memory cells 101 to be selectively operated (e.g., programmed, read, etc.). Accordingly, a memory device may be formed that includes the memory array 500.

In use and operation, when a memory cell 101 is selected to be programmed, a programming voltage may be applied to the memory cell 101 to change at least one property of a memory material associated the memory cell 101. In a read operation of the memory cell 101, a voltage is used to detect a state of the memory material of the memory cell 101. For example, read/write circuitry may be configured to sense a resistance of a selected memory cell 101 during read operations and may be configured to provide a current to a selected memory cell 101 to change at least one property of a memory material associated with the memory cell 101 during write operations.

Accordingly, in some embodiments, an electronic device comprises a processor, a memory array operably coupled to the processor, the memory array comprising memory cells each including a select device and a memory material, a first set of conductive lines on a side of the memory cells, a second set of conductive lines on an opposite side of the memory cells, a passive material between the memory cells and at least one of the first set of conductive lines and the second set of conductive lines, and a power supply in operable communication with the processor.

EXAMPLES

Example 1

An array of memory cells including a tungsten silicon nitride material as the passive material between the memory cells and access lines was formed. The memory cells were each located at an intersection of a first conductive line (e.g., a bit line) and a second conductive line (e.g., a word line). The tungsten silicon nitride material was disposed between the first conductive line and the memory cell and between the second conductive line and the memory cell.

Figure 6:
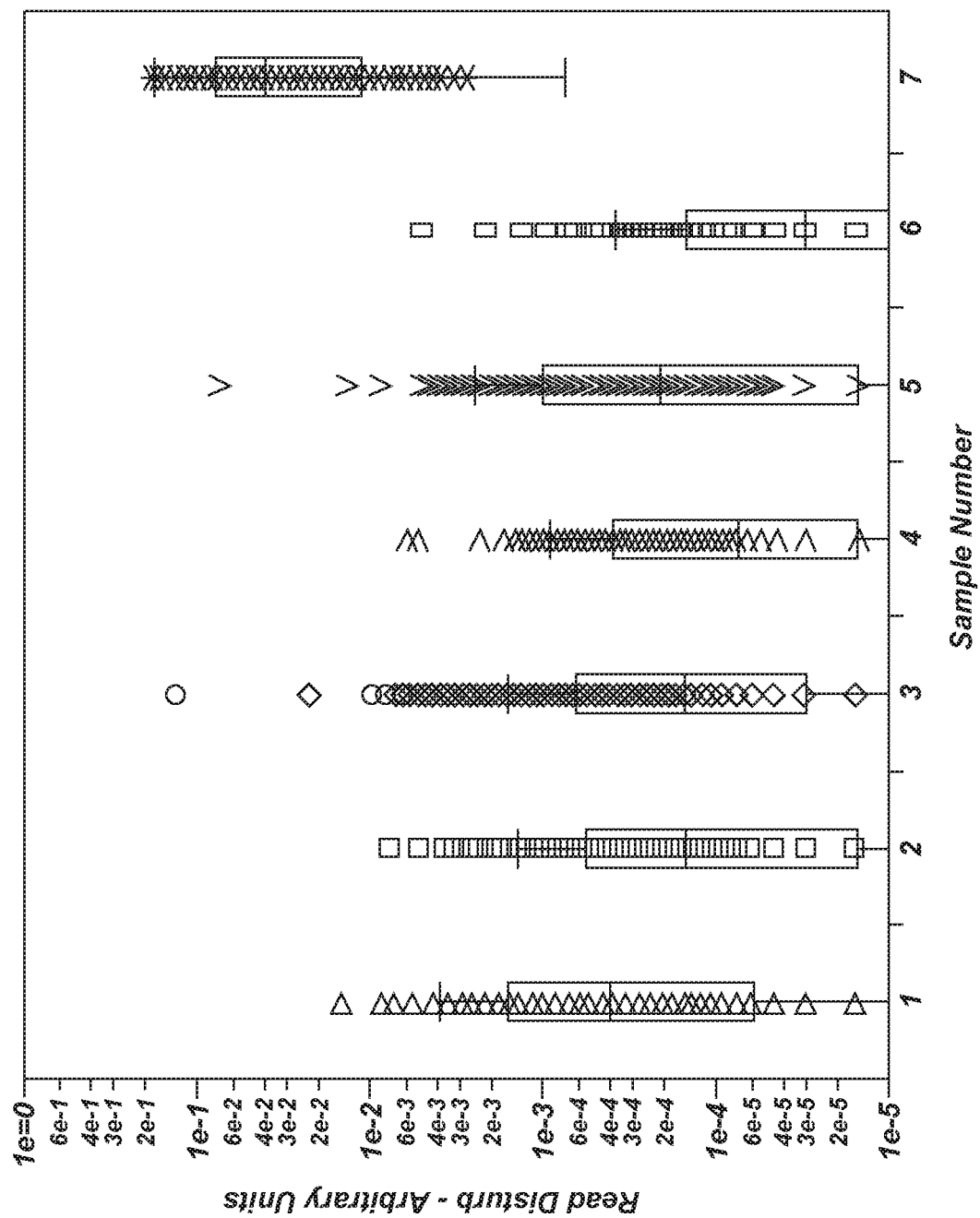
FIG. 6 is a graphical representation of the read disturb of memory cells including a tungsten silicon nitride material according to embodiments of the disclosure compared to a memory cell not including the tungsten silicon nitride material.

A plurality of memory cells including the tungsten silicon nitride material as the passive material between the memory cells and the conductive lines were exposed to a read current and a programming current to measure a read disturb of the memory cells. The read disturb of the memory cells was compared to a read disturb of a conventional memory cell not including the tungsten silicon nitride material between the conductive lines and the memory cells. FIG. 6 is a graphical representation of the read disturb of the memory cells including the tungsten silicon nitride material and the memory cell not including the tungsten silicon nitride material. In FIG. 6, Sample Numbers 1 through 6 represent memory cells having the tungsten silicon nitride material and Sample Number 7 represents a conventional memory cell not including the tungsten silicon nitride material. The amount of read disturb, which may be equivalent to an amount of electrons (e.g., a voltage, a current, etc.) flowing through the selected memory cell, was measured. A high read disturb may cause an undesired threshold programming or erasing of a logic state of a memory cell (e.g., may induce a phase change or a change in a property of a memory material). In other words, a high read disturb may correspond to a change in a state of memory cells after a read operation. A high read disturb may result in a disturb failure where an initial and expected state of a memory cell is changed (e.g., disturbed) to an opposite state responsive to reading of the same selected memory cell. With reference to FIG. 6, Sample Numbers 1 through 6 exhibited a reduction in an amount of read disturb.

Example 2

An array of memory cells including aluminum oxide as the passive material between the memory cells and access lines is formed. The memory cells are each located at an intersection of a first conductive line (e.g., a bit line) and a second conductive line (e.g., a word line). The aluminum oxide is disposed between the first conductive line and the memory cell and between the second conductive line and the memory cell.

The array including the aluminum oxide between the access lines and the memory cells exhibits a reduced read disturb, a reduced degree of variation in threshold voltage between memory cells, and a reduced shift in threshold voltage of a particular memory cell over the operating lifetime of the semiconductor device compared to arrays of memory cells not including the aluminum oxide between memory cells and access lines.

Example 3

An array of memory cells including aluminum oxide as the passive material between the memory cells and access lines is formed. A tungsten silicon nitride material is between the aluminum oxide and the memory cells. The memory cells are each located at an intersection of a first conductive line (e.g., a bit line) and a second conductive line (e.g., a word line). A first aluminum oxide material directly contacts the first conductive line and a second aluminum oxide material directly contacts the second conductive line. A tungsten silicon nitride material is between the first aluminum oxide material and the memory cell and another tungsten silicon nitride material is between the second aluminum oxide material and the memory cell.

The array including the aluminum oxide and the tungsten silicon nitride between the memory cells and the conductive access lines exhibits a reduced read disturb, a reduced degree of variation in threshold voltage between memory cells, and a reduced shift in threshold voltage of a particular memory cell over the operating lifetime of the semiconductor device compared to arrays of memory cells not including the aluminum oxide and the tungsten silicon nitride between memory cells and access lines.

Example 4

An array of memory cells including aluminum oxide as the passive material between the memory cells and access lines is formed. The aluminum oxide is between a tungsten silicon nitride material and the memory cells. The memory cells are each located at an intersection of a first conductive line (e.g., a bit line) and a second conductive line (e.g., a word line). A first aluminum oxide material directly contacts the memory cell and a tungsten silicon nitride material, which directly contacts the first conductive line. A second aluminum oxide material directly contacts the memory cell and another tungsten silicon nitride material, which directly contacts the second conductive line.

The array including the aluminum oxide and the tungsten silicon nitride between the memory cells and the conductive access lines exhibits a reduced read disturb, a reduced degree of variation in threshold voltage between memory cells, and a reduced shift in threshold voltage of a particular memory cell over the operating lifetime of the semiconductor device compared to arrays of memory cells not including the aluminum oxide and the tungsten silicon nitride between memory cells and access lines.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device, comprising:
an array of memory cells;
a first conductive line on a first side of a group of memory cells of the array of memory cells, the first conductive line extending in a first direction and extending between adjacent memory cells of the first group of memory cells;
a second conductive line on a second side of at least one memory cell of the first group of memory cells and extending in a second direction, the second conductive line extending between adjacent memory cells of a second group of memory cells including the at least one memory cell of the first group of memory cells;
a passive material between the at least one memory cell and the first conductive line, the passive material coextensive with the first conductive line; and
a semimetal material adjacent to the passive material and coextensive with the passive material and the first conductive line and comprising a material selected from the group consisting of a metal silicide and a metal silicon nitride.

2. The semiconductor device of claim 1, further comprising another passive material between the at least one memory cell and the second conductive line.

3. The semiconductor device of claim 2, wherein the another passive material comprises a different material composition than the passive material.

4. The semiconductor device of claim 1, wherein the passive material comprises aluminum oxide.

5. The semiconductor device of claim 1, wherein a thickness of the passive material is between about 0.5 nm and about 10 nm.

6. The semiconductor device of claim 1, wherein the passive material directly contacts the first conductive line.

7. The semiconductor device of claim 1, wherein the passive material directly contacts memory cells of the array of memory cells.

8. The semiconductor device of claim 1, wherein the semimetal material comprises tungsten silicon nitride (WSiN).

9. The semiconductor device of claim 1, wherein the semimetal material includes a same metal as the first conductive line.

10. The semiconductor device of claim 9, wherein the semimetal material has a thickness greater than a thickness of the passive material.

11. The semiconductor device of claim 1, wherein the memory cells each comprise a stack comprising a memory material.

12. The semiconductor device of claim 11, wherein the stack further comprises aluminum oxide proximate the memory material.

* * * * *